US008000950B2

(12) United States Patent
Hira et al.

(10) Patent No.: US 8,000,950 B2
(45) Date of Patent: Aug. 16, 2011

(54) RANDOM INITIALIZATION OF LATCHES IN AN INTEGRATED CIRCUIT DESIGN FOR SIMULATION

(75) Inventors: Kalpesh Hira, Austin, TX (US); Neil A. Panchal, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 444 days.

(21) Appl. No.: 12/173,217

(22) Filed: Jul. 15, 2008

(65) Prior Publication Data
US 2010/0017187 A1     Jan. 21, 2010

(51) Int. Cl.
G06F 17/50         (2006.01)
(52) U.S. Cl. ......................................................... 703/15
(58) Field of Classification Search ..................... 703/15
See application file for complete search history.

(56) References Cited

U.S. PATENT DOCUMENTS

| 5,870,316 | A | 2/1999 | Gilbert et al. |
| 6,061,819 | A * | 5/2000 | Bening et al. ................ 714/741 |
| 6,845,479 | B2 | 1/2005 | Illman |
| 7,024,345 | B1 | 4/2006 | Stamm et al. |
| 7,251,794 | B2 | 7/2007 | Blanco et al. |
| 2005/0222832 | A1 | 10/2005 | Smith et al. |
| 2007/0260433 | A1 | 11/2007 | Seki |

OTHER PUBLICATIONS

William K. Lam, "Hardware Design Verification: Simulation and Formal Method-based Approaches", 2005, Prentice Hall, pp. 1-6.*
Mike Turpin, "The Dangers of Living with an X (bugs hidden in your Verilog)", 2003, Synopsys Users Group Meeting, pp. 1-34.*
Lionel Bening, "A two-state methodology for RTL logic simulation", 1999, Proceedings of the 36th annual ACM/IEEE Design Automation Conference, six pages.*
F. Corno et al., "A new approach for initialization sequences computation for synchronous sequential circuits", 1997, IEEE International Conference on Computer Design: VLSI in Computers and Processors, pp. 381-386.*
Samir Palnitkar, "Verilog HDL A Guide to Digital Design and Synthesis", 1996, Sun Microsystems, p. 171.*
IBM Technical Disclosure Bulletin, "Orthogonal Test Pattern Generator," v. 38, n. 3, pp. 201-204 (Mar. 1995).

* cited by examiner

Primary Examiner — Paul L Rodriguez
Assistant Examiner — Russ Guill
(74) Attorney, Agent, or Firm — Matthew W. Baca; Jack V. Musgrove (57) ABSTRACT

Latches in a net of a simulated integrated circuit design are initialized to known logical states prior to application of a reset signal at the beginning of the simulation. The logical states may be set by generating a list of the latches, sorting them in random order, and then dividing them into two groups based on the random order with high and low logical states respectively assigned to the two groups. In a specific implementation the latch states are set using an HDL force command prior to applying the reset signal, and the force command is removed after applying the reset signal using an HDL release command. If the circuit description is a gate-level netlist, then logical states of gates within the storage elements are also set.

16 Claims, 5 Drawing Sheets

RANDOM INITIALIZATION OF LATCHES IN AN INTEGRATED CIRCUIT DESIGN FOR SIMULATION

BACKGROUND OF THE INVENTION

1. Field of the Invention

The present invention generally relates to the design of integrated circuits, and more particularly to a method of simulating the operation of an integrated circuit design which has a plurality of signal storage elements such as latches.

2. Description of the Related Art

Integrated circuits are used for a wide variety of electronic applications, from simple devices such as wristwatches, to the most complex computer systems. A microelectronic integrated circuit (IC) chip can generally be thought of as a collection of logic cells with electrical interconnections between the cells, formed on a semiconductor substrate (e.g., silicon). An IC may include a very large number of cells and require complicated connections between the cells. A cell is a group of one or more circuit elements such as transistors, capacitors, resistors, inductors, and other basic circuit elements grouped to perform a logic function. Cell types include, for example, core cells, scan cells and input/output (I/O) cells. Each of the cells of an IC may have one or more pins, each of which in turn may be connected to one or more other pins of the IC by wires. The wires connecting the pins of the IC are also formed on the surface of the chip. For more complex designs, there are typically at least four distinct layers of conducting media available for routing, such as a polysilicon layer and three metal layers (metal-1, metal-2, and metal-3). The polysilicon layer, metal-1, metal-2, and metal-3 are all used for vertical and/or horizontal routing.

An IC chip is fabricated by first conceiving the logical circuit description, and then converting that logical description into a physical description, or geometric layout. This process is usually carried out using a "netlist," which is a record of all of the nets, or interconnections, between the cell pins. A layout typically consists of a set of planar geometric shapes in several layers. The layout is then checked to ensure that it meets all of the design requirements, particularly timing requirements. The result is a set of design files known as an intermediate form that describes the layout. The design files are then converted into pattern generator files that are used to produce patterns called masks by an optical or electron beam pattern generator. During fabrication, these masks are used to pattern a silicon wafer using a sequence of photolithographic steps. The process of converting the specifications of an electrical circuit into a layout is called the physical design.

Due to the large number of components and the details required by the fabrication process for very large scale integrated (VLSI) devices, physical design is not practical without the aid of computers. As a result, most phases of physical design extensively use computer-aided design (CAD) tools, and many phases have already been partially or fully automated. Automation of the physical design process has increased the level of integration, reduced turn around time and enhanced chip performance. Several different programming languages have been created for electronic design automation (EDA), including Verilog, VHDL and TDML. A typical EDA system receives one or more high level behavioral descriptions of an IC device, and translates this high level design language description into netlists of various levels of abstraction.

Physical synthesis is prominent in the automated design of integrated circuits such as high performance processors and application specific integrated circuits (ASICs). Physical synthesis is the process of concurrently optimizing placement, timing, power consumption, crosstalk effects and the like in an integrated circuit design using various simulation and analysis tools. This comprehensive approach helps to eliminate iterations between circuit analysis and place-and-route. Physical synthesis has the ability to repower gates (changing their sizes), insert repeaters (buffers or inverters), clone gates or other combinational logic, etc., so the area of logic in the design remains fluid.

Faster performance and predictability of responses are elements of interest in circuit designs. As process technology scales to the deep-submicron (DSM) regime, it becomes more difficult to accurately model circuit performance, particularly regarding unknown behaviors of circuit components. One situation that may lead to unknown behaviors relates to the initialized states of latches in a circuit design. A binary latch captures an input data signal ("0" or "1") each time a clock control is activated, and passes the captured value to its output. However, at circuit reset during the simulation the latches have not captured any particular value and so have an indeterminate binary state, represented in some conventional circuit simulators as an "X" value.

This situation is not a problem in behavioral register transfer level (RTL) simulation, but can create difficulties in gate-level netlist simulation depending on how the synthesis tool implements the synchronous reset function. While both the behavioral RTL and the gate-level netlist are logically equivalent, their simulation behaviors differ. This difference may be illustrated using the following two Verilog expressions for latch assignment with a standard edge-triggered data flip-flop:

$$RegA<=(RegA+Reset)' \quad (1)$$

$$RegA<=(RegA+(RegA)'(Reset))' \quad (2)$$

In the first expression (RTL), register A is assigned the complementary value of the logical OR combination of the existing value in register A and the reset value. In the second expression (gate-level netlist of the same latch), register A is assigned the complementary value of the logical OR combination of the existing value in register A and the logical AND combination of the complement of the existing value in register A and the reset value. Application of DeMorgan's Theorem shows that both of these expressions are logically equivalent; however, the simulation behavior is different when a reset is applied. When the simulator is first started, all registers in the design are un-initialized and therefore are at an "X" state. In the first expression, the assertion (logic "1") of "Reset" when "RegA" is at its un-initialized state will result in a transition of "RegA" to a logic "0" independent of the existing state of "RegA", i.e., the expression translates to RegA<=(X+1)', and a logic "1" ORed with anything will always produce a logic "1". In the second expression, the assertion (logic "1") of "Reset" when "RegA" is at its un-initialized state will result in "RegA" remaining indeterminate, i.e., the expression translates to RegA<=(X+X'(1))', and a logic "1" ANDed with an "X" will always produce an "X" since the resultant value is dependent upon the state of "X".

Figure 1:
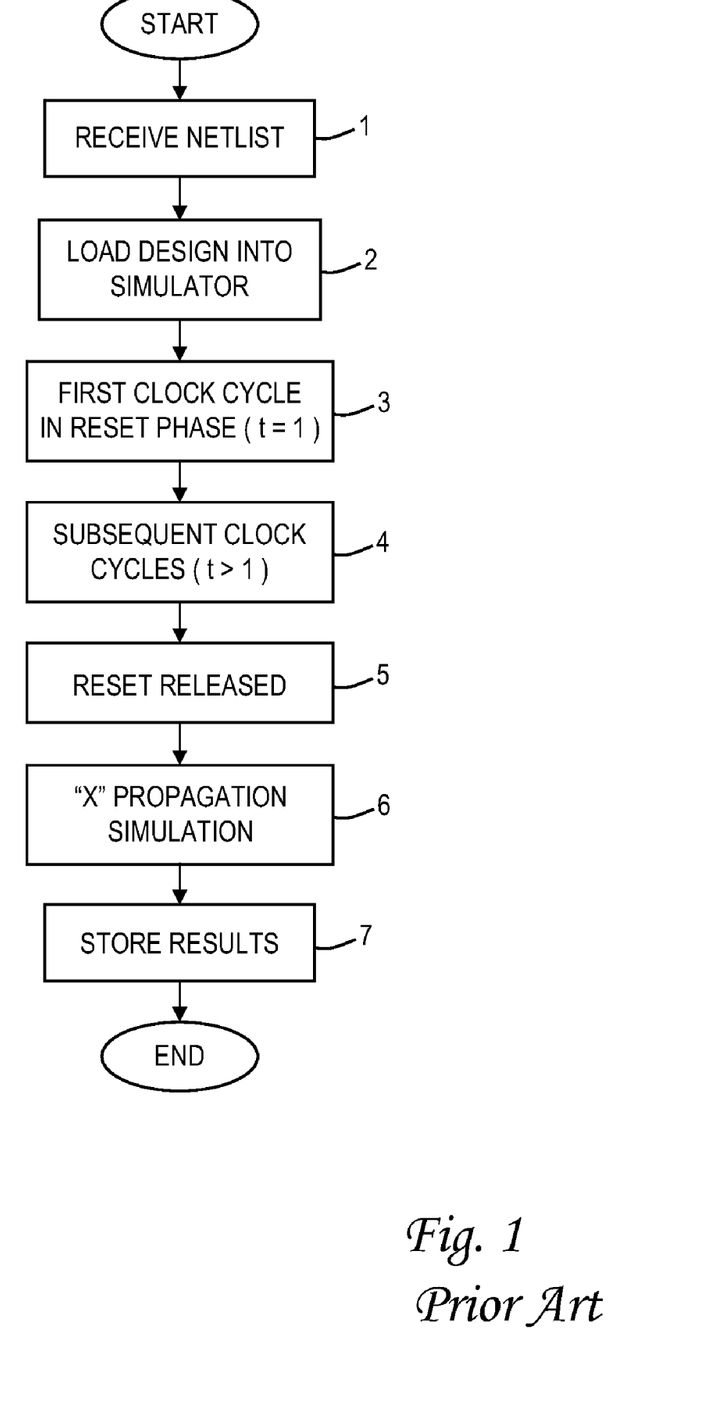
FIG. 1 is a chart illustrating the logical flow for conventional simulation of an integrated circuit design having a plurality of latches, wherein indeterminate ("X") latch states propagate after circuit reset.

These "X" values can propagate throughout the circuit design during gate-level netlist simulation, as illustrated by the flow chart of FIG. 1 which shows a typical simulation process. The process begins when the simulation tool receives the circuit description or netlist (1). The circuit design is loaded into the simulator (2) and a reset phase begins its first cycle (3). There are one or more additional clock cycles during the reset phase (4), and the reset signal is then released (5). Any indeterminate "X" values then propagate during simulation of circuit operation to the extent allowed by the simulator (6). The ending results (states of the various circuit components) are stored for further analysis and processing (7). The simulation may not, however, be completed to the point desired due to the "X" propagation. Since registers may remain in an indeterminate state despite the application of a synchronous reset executed by the simulation tool, the simulation is unable to progress when specific values become necessary as inputs to downstream circuit components.

Circuit designers continually search for efficient techniques to accurately characterize these unknown behaviors. One known solution is to pass certain flags to the synthesis tool that causes the reset circuitry to be mapped in a manner that does not cause the outputs of the latches to be un-initialized after the assertion of a reset. The drawback of this approach is that choosing and setting these flags requires an highly experienced designer and intricate knowledge of the synthesis tool, which differs from vendor to vendor. Moreover, the resulting gate-level implementation after applying these flags has been shown to be inconsistent from design to design, thus requiring several synthesis iterations to produce a netlist that simulates correctly. Computational requirements are significantly increasing with the ever larger numbers of latches present in modern integrated circuit designs. These iterations should be unnecessary if the behavioral RTL and gate-level netlist are logically equivalent. It would, therefore, be desirable to devise an improved method of circuit simulation which can proceed without requiring a re-synthesis of the original RTL of the design. It would be further advantageous if the method could easily be implemented to enhance existing design tools.

SUMMARY OF THE INVENTION

It is therefore one object of the present invention to provide an improved method of simulating the operation of an integrated circuit design which includes a plurality of signal storage cells such as latches.

It is another object of the present invention to provide such a method which eliminates the propagation of indeterminate signals from one or more of the latches arising from circuit reset.

It is yet another object of the present invention to provide such a method which can be used independent of how the design was synthesized, e.g., behavioral RTL or gate-level netlist.

The foregoing objects are achieved in a method of initializing binary storage elements in a net of a simulated integrated circuit design, by receiving a circuit description for the net, setting a first group of the storage elements in the circuit description to a logic low state during a first clock cycle, setting a second group of the storage elements in the circuit description to a logic high state during the first clock cycle, and applying a reset signal to the net beginning at a second clock cycle subsequent to the first clock cycle. A list of the storage elements in the circuit description may be generated and sorted into a random order, and the states of the first and second groups of storage elements are preferably set by selectively assigning the logic low state or the logic high state based on this random order. In a specific implementation the states of the storage elements are set using an HDL (hardware description language) force command prior to applying the reset signal, and the force command is removed after applying the reset signal using an HDL release command. If the circuit description is a gate-level netlist, then logical states of gates within the storage elements are also set.

The above as well as additional objectives, features, and advantages of the present invention will become apparent in the following detailed written description.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
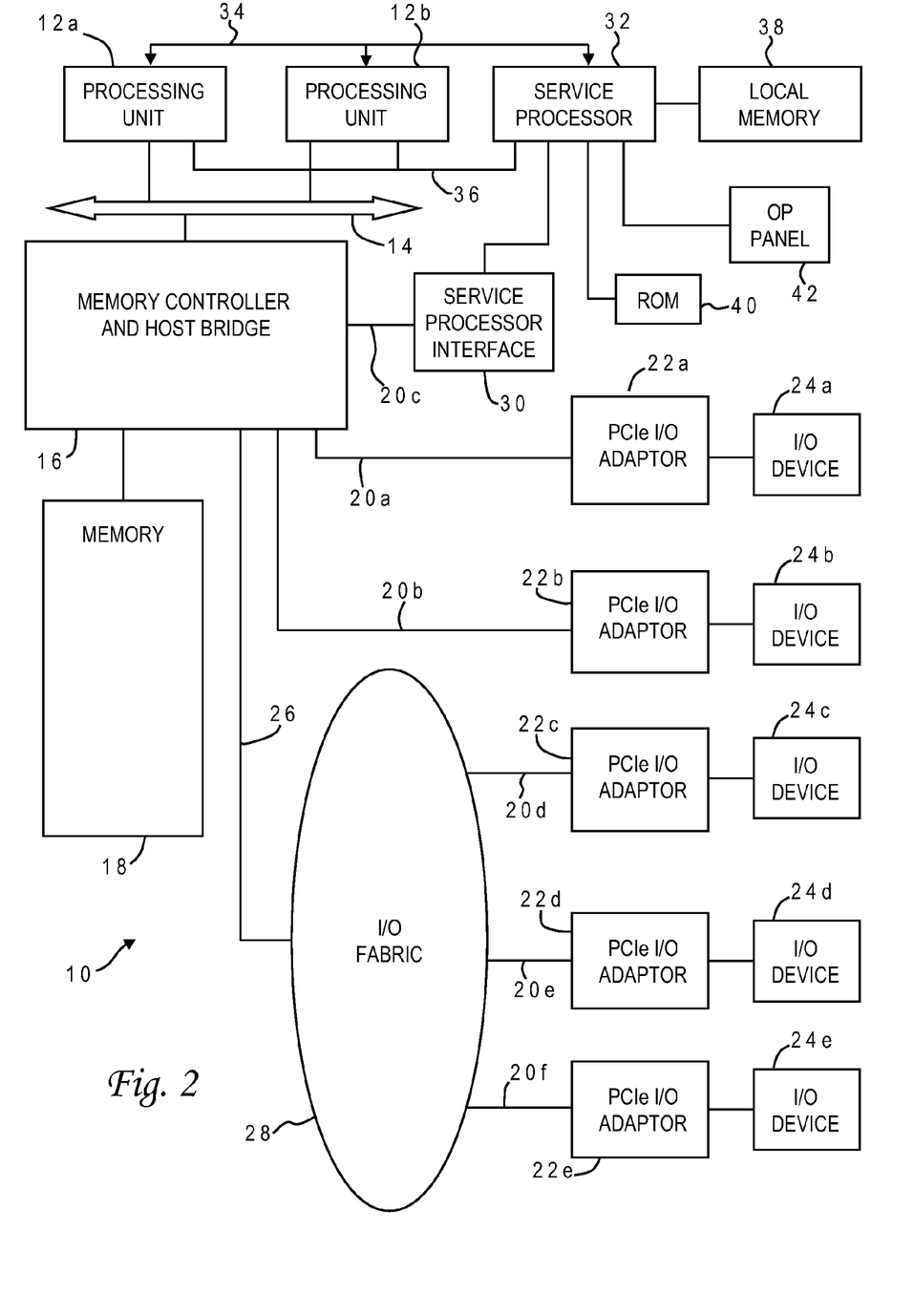
FIG. 2 is a block diagram of a computer system programmed to carry out computer-aided design and simulation of an integrated circuit in accordance with one implementation of the present invention.

With reference now to the figures, and in particular with reference to FIG. 2, there is depicted one embodiment 10 of a computer system in which the present invention may be implemented to carry out simulation of logic structures in an integrated circuit design. Computer system 10 is a symmetric multiprocessor (SMP) system having a plurality of processors 12a, 12b connected to a system bus 14. System bus 14 is further connected to a combined memory controller/host bridge (MC/HB) 16 which provides an interface to system memory 18. System memory 18 may be a local memory device or alternatively may include a plurality of distributed memory devices., preferably dynamic 10 random-access memory (DRAM). There may be additional structures in the memory hierarchy which are not depicted, such as on-board (L1) and second-level (L2) or third-level (L3) caches.

MC/HB 16 also has an interface to peripheral component interconnect (PCI) Express links 20a, 20b, 20c. Each PCI Express (PCIe) link 20a, 20b is connected to a respective PCIe adaptor 22a, 22b, and each PCIe adaptor 22a, 22b is connected to a respective input/output (I/O) device 24a, 24b. MC/HB 16 may additionally have an interface to an I/O bus 26 which is connected to a switch (I/O fabric) 28. Switch 28 provides a fan-out for the I/O bus to a plurality of PCI links 20d, 20e, 20f. These PCI links are connected to more PCIe adaptors 22c, 22d, 22e which in turn support more I/O devices 24c, 24d, 24e. The I/O devices may include, without limitation, a keyboard, a graphical pointing device (mouse), a microphone, a display device, speakers, a permanent storage device (hard disk drive) or an array of such storage devices, an optical disk drive, and a network card. Each PCIe adaptor provides an interface between the PCI link and the respective I/O device. MC/HB 16 provides a low latency path through which processors 12*a*, 12*b* may access PCI devices mapped anywhere within bus memory or I/O address spaces. MC/HB 16 further provides a high bandwidth path to allow the PCI devices to access memory 18. Switch 28 may provide peer-to-peer communications between different endpoints and this data traffic does not need to be forwarded to MC/HB 16 if it does not involve cache-coherent memory transfers. Switch 28 is shown as a separate logical component but it could be integrated into MC/HB 16.

In this embodiment, PCI link 20*c* connects MC/HB 16 to a service processor interface 30 to allow communications between I/O device 24*a* and a service processor 32. Service processor 32 is connected to processors 12*a*, 12*b* via a JTAG interface 34, and uses an attention line 36 which interrupts the operation of processors 12*a*, 12*b*. Service processor 32 may have its own local memory 38, and is connected to read-only memory (ROM) 40 which stores various program instructions for system startup. Service processor 32 may also have access to a hardware operator panel 42 to provide system status and diagnostic information.

In alternative embodiments computer system 10 may include modifications of these hardware components or their interconnections, or additional components, so the depicted example should not be construed as implying any architectural limitations with respect to the present invention.

When computer system 10 is initially powered up, service processor 32 uses JTAG interface 34 to interrogate the system (host) processors 12*a*, 12*b* and MC/HB 16. After completing the interrogation, service processor 32 acquires an inventory and topology for computer system 10. Service processor 32 then executes various tests such as built-in-self-tests (BISTs), basic assurance tests (BATs), and memory tests on the components of computer system 10. Any error information for failures detected during the testing is reported by service processor 32 to operator panel 42. If a valid configuration of system resources is still possible after taking out any components found to be faulty during the testing then computer system 10 is allowed to proceed. Executable code is loaded into memory 18 and service processor 32 releases host processors 12*a*, 12*b* for execution of the program code, e.g., an operating system (OS) which is used to launch applications and in particular the circuit design simulation application of the present invention, results of which may be stored in a hard disk drive of the system (an I/O device 24). While host processors 12*a*, 12*b* are executing program code, service processor 32 may enter a mode of monitoring and reporting any operating parameters or errors, such as the cooling fan speed and operation, thermal sensors, power supply regulators, and recoverable and non-recoverable errors reported by any of processors 12*a*, 12*b*, memory 18, and MC/HB 16. Service processor 32 may take further action based on the type of errors or defined thresholds.

While the illustrative implementation provides program instructions embodying the present invention on disk drive 36, those skilled in the art will appreciate that the invention can be embodied in a program product utilizing other computer-readable media. The program instructions may be written for example in the C++ programming language for an AIX environment. Computer system 10 carries out program instructions for a simulation process that uses novel latch initialization techniques to avoid the propagation of indeterminate latch states. Accordingly, a program embodying the invention may include conventional aspects of various circuit design and simulation tools, and these details will become apparent to those skilled in the art upon reference to this disclosure.

A simulator tool of the present invention randomly assigns values to binary storage elements during reset, and subsequently releases them, so that they take on a natural state for logic progression during simulation of circuit operation. While the invention is particularly suited for simulation of circuits having latches, it is equally applicable to circuits having other storage elements such as registers which may be initialized in a similar manner. The term "latch" as used herein further refers to any kind of binary latch circuit including by way of example without limitation set-reset (SR) latches or flip-flop (master-slave) latches. In the examples used herein the invention is applied to an integrated circuit design having edge-triggered data flip-flop (DFF) latches. These latches have an input pin (D), an output pin (L2), and a clock control pin (CLK). At the gate level these latches have three pairs of cross-connected NAND gates.

Additional inputs on the DFF in the gate-level netlist after scan/test insertion may include a plurality of scan clocks (A,B, and C) and a scan input (1), to satisfy the requirements of level-sensitive scan design (LSSD) testing. However, such additional latch inputs are not applicable for functional simulation and are therefore beyond the scope of this invention.

This invention forces the L2 outputs of most or all latches in a circuit design to random values, either logical low ("0") or logical high ("1") at the beginning of the simulation. Since all latches in the design are known, the assertion of a synchronous reset through combinational logic can no longer be blocked by a latch's un-initialized state. The L2 outputs are forced to a known state for a single clock cycle while the reset command is applied. This forced assignment results in any edge-triggered latch capturing determinate data on the subsequent clock edge. No indeterminate values ("X") result and therefore cannot propagate. The release of the reset guarantees that latches will be initialized to these known states. If a specific latch in the net should not (or need not) be randomly initialized it can be excluded from the generated list of latches.

Figure 3:
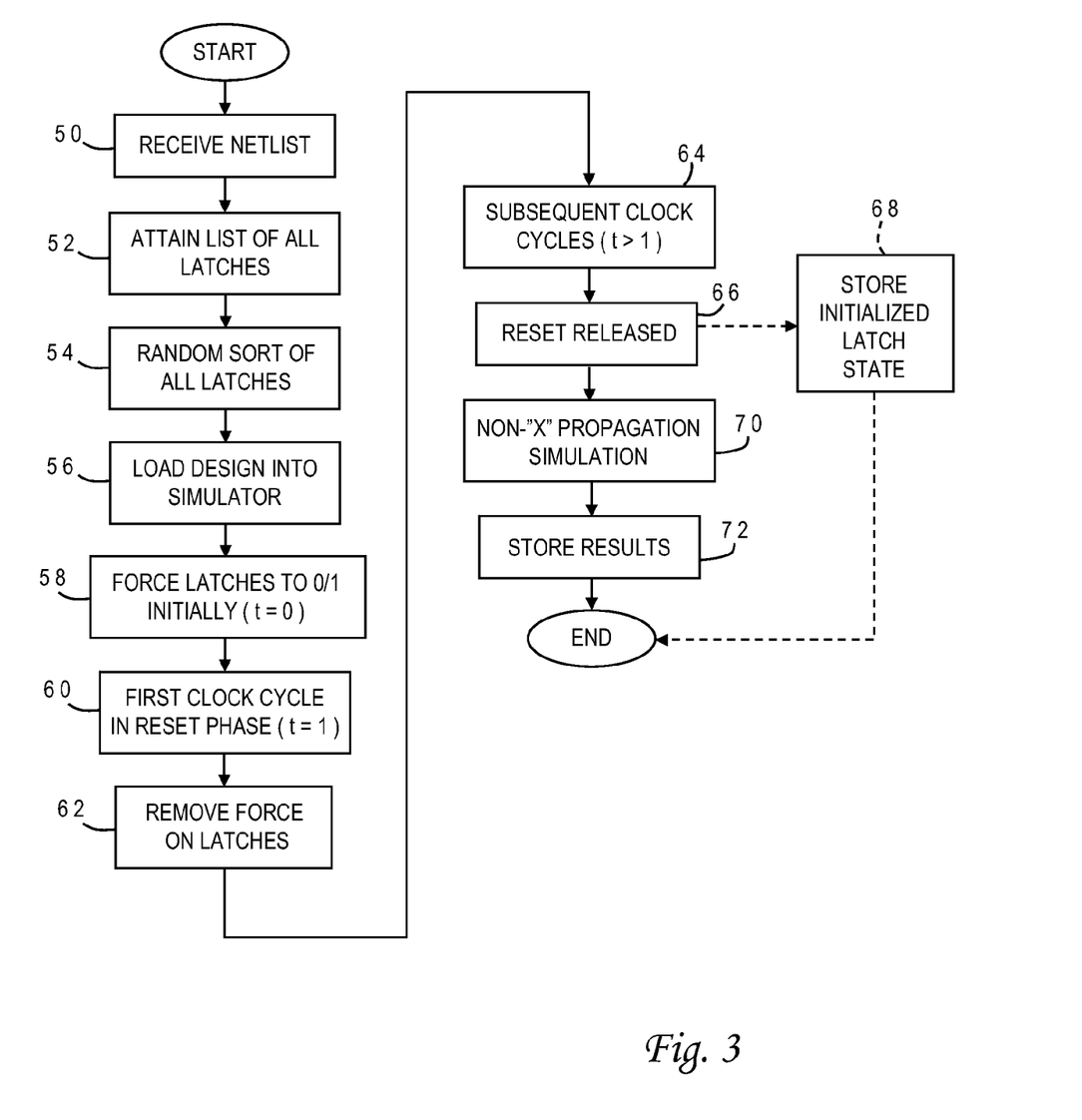
FIG. 3 is a chart illustrating the logical flow for simulation of an integrated circuit design having a plurality of latches in accordance with one implementation of the present invention wherein the latches are randomly initialized for circuit reset.

The invention may be further understood with reference to the flow chart of FIG. 3 which illustrates one implementation for latch initialization and circuit simulation. The process begins when the simulation tool receives the circuit description or netlist (50). The invention is particularly suited to handle a gate-level netlist which may exhibit a different simulation behavior than, e.g., register transfer level as explained in the Background section. A list of all latches in the netlist is then generated (52). The list may be generated in various ways, for example according to the sequence that latches are found in the netlist, or according to some hierarchy such as latch design or sub-class. Next, the latches in the list are randomly sorted, i.e., placed in a random order (54). The term "random" as used herein includes-pseudo-random computation algorithms. The design is loaded into a simulator, e.g., a modified Verilog simulator (56). A force command is applied to the latches prior to any clock cycle (time=0) to initially set them to logical "0" or logical "1" based on the randomized order (58). Forcing may be carried out by the hardware description language (HDL) "force" command in an HDL module file which in turn may be called by a top-level test bench module. For a gate-level netlist the force sets logical states of gates within the latches. At some subsequent clock cycle, e.g., the first clock cycle (time=1) the reset phase begins (60). After the slowest clock in the design is generated and clocks through one complete cycle in the reset phase, the forces are released simultaneously from all latches using the VHDL "release" command (62). At the latch pin-out level, the clock propagates one cycle through the CLK pin. The reset signal is applied for one or more subsequent clock cycles, e.g., four cycles total (64), and the reset is released (66). At this point the initialized latch state may be stored for later processing (68), or the process may continue with simulation of the operation of the circuit over incremental time steps, which occurs without any propagation of indeterminate latch states (70). Appropriate simulators include for example Cadence NC-Verilog or Mentor Graphics ModelSim. The results of the simulation are then stored for later analysis (72).

Figure 4:
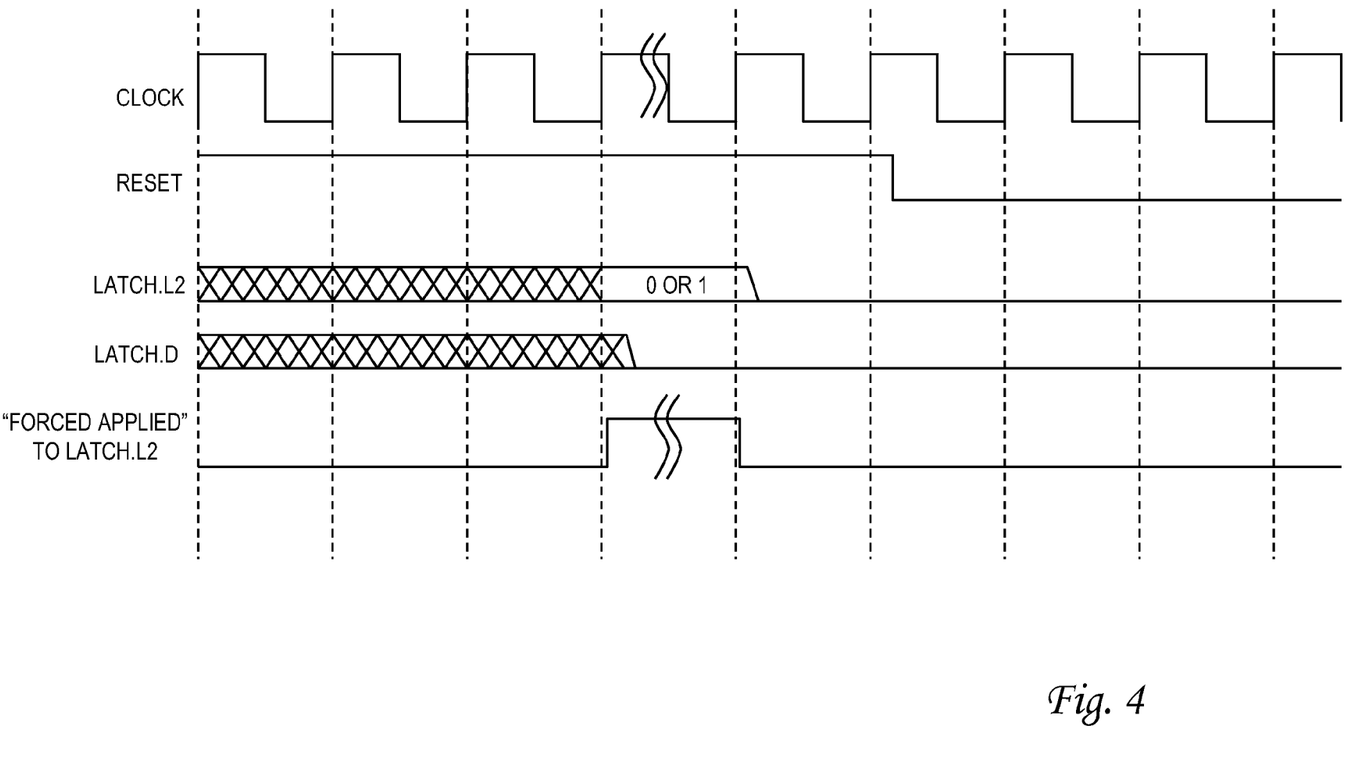
FIG. 4 is a timing diagram illustrating clock, reset and force signals which are applied during simulation of an integrated circuit design, and the values of a given latch input and output in accordance with one implementation of the present invention.

FIG. 4 shows the various signals and latch states before and after reset according to a specific implementation of the present invention. The clock signal has a 50% duty cycle with each cycle corresponding to some time increment for operation of the circuit, e.g., 1 picosecond. The states of the latch input (D) and output (L2) are indeterminate at first, when the reset signal is applied. When the force is applied to the latch the input data is set to "0" and the output state is set to either "0" or "1" depending on the random assignment. The force may be applied for more than one clock cycle. After the force is released, the reset signal is deactivated.

Figure 5:
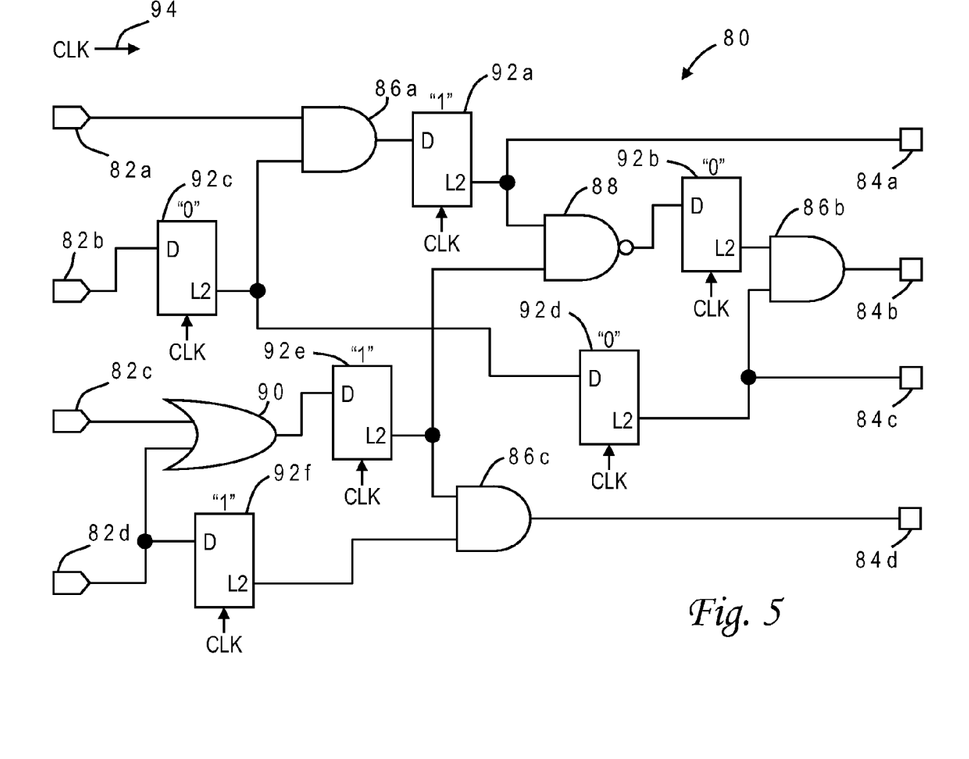
FIG. 5 is a schematic diagram of an exemplary net for an integrated circuit design having latches which may be initialized in accordance with the present invention.

FIG. 5 illustrates a sample net 80 for an integrated circuit design which may be initialized in accordance with the present invention. Net 80 includes several sources 82a, 82b, 82c, 82d and several sinks 84a, 84b, 84c, 84d interconnected by combinational logic including AND gates 86a, 86b, 86c, NAND gate 88, and OR gate 90. Net 80 also includes six latches 92a, 92b, 92c, 92d, 92e, 92f. A clock signal 94 is used to trigger the latches and thereby capture an input state of each latch. A global reset signal (not shown) propagates through combinatorial logic to the D-pin of each latch 92, e.g., via a logic structure represented by expression (2) in the Background section.

Figure 6:
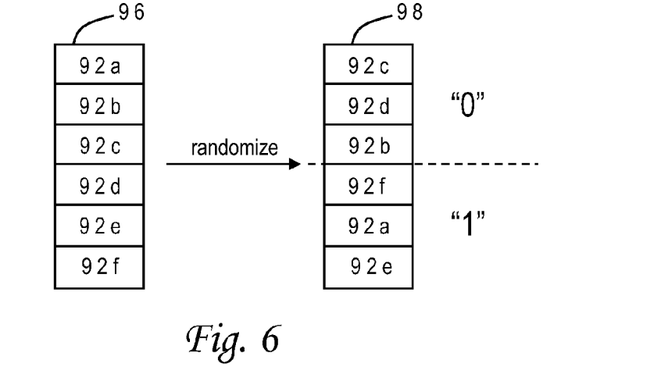
FIG. 6 is a pictorial representation of a list of latches in the net of FIG. 5 which are randomized and assigned logical values in accordance with one implementation of the present invention.

As further depicted in FIG. 6, the latches are added to an initial list 96. As noted above, the initial list of latches is not required to be in any particular order. This list is then randomly sorted to derive a randomized list 98. Latches in the first (top) half of the randomized list are selectively assigned a logical "0" while latches in the second (bottom) half are assigned a logical "1". These initialized latch state assignments are reflected in FIG. 5. While the illustrative implementation divides the list into equal halves in order to make the assignments, the division does not necessarily have to be half-and-half, more complicated sorting or state assignment can be devised. Also, if there are an odd number of latches the cut line can leave one more latch in one latch set than in another latch set. Randomization of the list of latches provides a preferred distribution of the logical values, but alternative techniques may be used to initialize the latches to known states prior to or concurrent with the reset, for example by assigning high and low latch states in succession based on the order that they appear in the netlist.

In this manner no indeterminate "X" values will result or propagate, since all latches have been initialized to known, albeit random, values. This approach more realistically models the circuit behavior since the physical circuit will pass an actual binary value and not an indeterminate value. No re-synthesis of the design is required to fix synchronous reset-related simulation issues, once it has been determined that the behavioral RTL and gate-level netlist are Boolean equivalent. A verification engineer can proceed to simulate the design independent of how the design was synthesized, and no detailed understanding of the logic is required, such as identification of reset-dependent latches. Given that many designs utilize third party proprietary components, a significant amount of time can be saved by avoiding excess synthesis iterations for the sole purpose of simulation. The present invention thus provides a substantial enhancement to existing simulation tools.

Although the invention has been described with reference to specific embodiments, this description is not meant to be construed in a limiting sense. Various modifications of the disclosed embodiments, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A method of initializing binary storage elements in a net of an integrated circuit design which is to be simulated, comprising:
   receiving a circuit description for the net;
   generating a list of storage elements in the circuit description;
   sorting the list of storage elements into a random order;
   setting a first group of the storage elements in the circuit description to a logic low state during a first clock cycle;
   setting a second group of the storage elements in the circuit description to a logic high state during the first clock cycle, wherein the states of the first and second groups of storage elements are set by selectively assigning the logic low state or the logic high state based on the random order of the storage elements; and
   applying a reset signal to the net beginning at a second clock cycle subsequent to the first clock cycle.

2. The method of claim 1 wherein the first and second groups of storage elements together constitute all storage elements in the circuit description.

3. The method of claim 1 wherein the second clock cycle immediately follows the first clock cycle.

4. The method of claim 1 wherein the states of the first and second groups of storage elements are set using a force command prior to said applying of the reset signal, and further comprising removing the force command after said applying of the reset signal using a release command.

5. The method of claim 1 wherein the circuit description is a gate-level netlist and said setting of the first and second groups of storage elements includes setting logical states of gates within the storage elements.

6. A computer system comprising:
   one or more processors which process program instructions;
   a memory device connected to said one or more processors; and
   program instructions residing in said memory device for initializing binary storage elements in a net of a simulated integrated circuit design by receiving a circuit description for the net, generating a list of storage elements in the circuit description, sorting the list of storage elements into a random order, setting a first group of the storage elements in the circuit description to a logic low state during a first clock cycle, setting a second group of the storage elements in the circuit description to a logic high state during the first clock cycle, wherein the states of the first and second groups of storage elements are set by selectively assigning the logic low state or the logic high state based on the random order of the storage elements, and applying a reset signal to the net beginning at a second clock cycle subsequent to the first clock cycle.

7. The computer system of claim 6 wherein the first and second groups of storage elements together constitute all storage elements in the circuit description.

8. The computer system of claim 6 wherein the second clock cycle immediately follows the first clock cycle.

9. The computer system of claim 6 wherein the states of the first and second groups of storage elements are set using a force command prior to said applying of the reset signal, and further comprising removing the force command after said applying of the reset signal using a release command.

10. The computer system of claim 6 wherein the circuit description is a gate-level netlist and said setting of the first and second groups of storage elements includes setting logical states of gates within the storage elements.

11. A computer program product comprising:
   a computer-readable storage medium; and
   program instructions residing in said medium for initializing binary storage elements in a net of a simulated integrated circuit design by receiving a circuit description for the net, generating a list of storage elements in the circuit description, sorting the list of storage elements into a random order, setting a first group of the storage elements in the circuit description to a logic low state during a first clock cycle, setting a second group of the storage elements in the circuit description to a logic high state during the first clock cycle, wherein the states of the first and second groups of storage elements are set by selectively assigning the logic low state or the logic high state based on the random order of the storage elements, and applying a reset signal to the net beginning at a second clock cycle subsequent to the first clock cycle.

12. The computer program product of claim 11 wherein the first and second groups of storage elements together constitute all storage elements in the circuit description.

13. The computer program product of claim 11 wherein the second clock cycle immediately follows the first clock cycle.

14. The computer program product of claim 11 wherein the states of the first and second groups of storage elements are set using a force command prior to said applying of the reset signal, and further comprising removing the force command after said applying of the reset signal using a release command.

15. The computer program product of claim 11 wherein the circuit description is a gate-level netlist and said setting of the first and second groups of storage elements includes setting logical states of gates within the storage elements.

16. A method of modeling the behavior of a net of an integrated circuit design, comprising:
   receiving a circuit description for the net which includes a plurality of storage elements;
   initializing the storage elements to known logical states by generating a list of storage elements in the circuit description, sorting the list of storage elements into a random order, dividing the storage elements into at least first and second groups based on the random order, setting the first group of the storage elements to a logic low state, and setting the second group of the storage elements to a logic high state;
   applying a reset signal to the net after said initializing; and
   simulating operation of the net over incremental time steps after applying the reset signal.

\* \* \* \* \*